(12) United States Patent
Qin et al.

(10) Patent No.: US 12,156,459 B2
(45) Date of Patent: Nov. 26, 2024

(54) DISPLAY PANELS, DISPLAY APPARATUSES AND PREPARATION METHODS OF DISPLAY PANEL

(71) Applicant: Yungu (Gu'an) Technology Co., Ltd., Hebei (CN)

(72) Inventors: Shaoyang Qin, Kunshan (CN); Shoukun Wang, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 487 days.

(21) Appl. No.: 17/469,127

(22) Filed: Sep. 8, 2021

(65) Prior Publication Data

US 2021/0408511 A1 Dec. 30, 2021

Related U.S. Application Data

(63) Continuation of application No. PCT/CN2020/095659, filed on Jun. 11, 2020.

(30) Foreign Application Priority Data

Aug. 28, 2019 (CN) .......................... 201910803280.2
Sep. 24, 2019 (CN) .......................... 201910903505.1

(51) Int. Cl.
*H10K 71/00* (2023.01)
*H10K 50/844* (2023.01)
(Continued)

(52) U.S. Cl.
CPC ........... *H10K 71/00* (2023.02); *H10K 50/844* (2023.02); *H10K 59/122* (2023.02);
(Continued)

(58) Field of Classification Search
CPC .... H10K 71/00; H10K 59/131; H10K 59/122; H10K 59/124; H10K 59/1201; H10K 50/844; H10K 77/111
See application file for complete search history.

(56) References Cited

U.S. PATENT DOCUMENTS 9,632,487 B2   4/2017 Kim et al.
10,205,122 B2  2/2019 Choi et al.
(Continued)

FOREIGN PATENT DOCUMENTS

CN    105957830 A    9/2016
CN    106409867 A    2/2017
(Continued)

OTHER PUBLICATIONS

State Intellectual Property Office of the People's Republic of China, Office Action and Search Report Issued in Application No. 201910803280.2, Mar. 23, 2021, 15 pages. (Submitted with Machine Translation).

(Continued)

*Primary Examiner* — Timor Karimy
(74) *Attorney, Agent, or Firm* — Maier & Maier, PLLC

(57) ABSTRACT

A display panel, a display apparatus and a preparation method of a display panel. The display panel includes a substrate, a display region and a non-display region. The non-display region includes a hole region and an isolation region adjoining the display region and the hole region. The isolation region includes at least one second isolation structure at least partially surrounding the hole region. The second isolation structure includes a supporting portion and a partitioning portion located on the supporting portion. An orthographic projection of the partitioning portion on the substrate covers an orthographic projection of the supporting portion on the substrate, and a maximum width of the supporting portion is smaller than a width of the partitioning (Continued)

portion. A tensile stress layer configured to apply a tensile stress to the partitioning portion is disposed on the partitioning portion.

12 Claims, 13 Drawing Sheets

(51) Int. Cl.
  *H10K 59/122*  (2023.01)
  *H10K 59/124*  (2023.01)
  *H10K 59/131*  (2023.01)
  *H10K 59/12*   (2023.01)
  *H10K 77/10*   (2023.01)

(52) U.S. Cl.
  CPC ......... *H10K 59/124* (2023.02); *H10K 59/131* (2023.02); *H10K 59/1201* (2023.02); *H10K 77/111* (2023.02)

(56) References Cited

U.S. PATENT DOCUMENTS

| | | | |
|---|---|---|---|
| 10,224,383 | B2 | 3/2019 | Park et al. |
| 10,396,311 | B2 | 8/2019 | Lee et al. |
| 10,553,819 | B2 | 2/2020 | Kim et al. |
| 10,644,261 | B2 | 5/2020 | Lee et al. |
| 2017/0031323 | A1 | 2/2017 | Kim et al. |
| 2017/0148856 | A1* | 5/2017 | Choi ................... H10K 59/124 |
| 2019/0074479 | A1 | 3/2019 | Lee et al. |
| 2019/0245159 | A1* | 8/2019 | Kim .................... H10K 50/8426 |
| 2019/0348633 | A1 | 11/2019 | Lee et al. |
| 2020/0212353 | A1 | 7/2020 | Kim et al. |
| 2021/0408511 | A1 | 12/2021 | Qin et al. |

FOREIGN PATENT DOCUMENTS

| | | |
|---|---|---|
| CN | 106887523 A | 6/2017 |
| CN | 107104127 A | 8/2017 |
| CN | 107452894 A | 12/2017 |
| CN | 107785502 A | 3/2018 |
| CN | 108258146 A | 7/2018 |
| CN | 108321181 A | 7/2018 |
| CN | 108666347 A | 10/2018 |
| CN | 109427861 A | 3/2019 |
| CN | 109786427 A | 5/2019 |
| CN | 109801956 A | 5/2019 |
| CN | 109802052 A | 5/2019 |
| CN | 109904212 A | 6/2019 |
| CN | 109904349 A | 6/2019 |
| CN | 109935730 A | 6/2019 |
| CN | 110120464 A | 8/2019 |
| CN | 110137370 A | 8/2019 |
| CN | 110137375 A | 8/2019 |
| CN | 110190104 A | 8/2019 |
| CN | 110416282 A | 11/2019 |
| CN | 110649177 A | 1/2020 |
| IN | 107579171 A | 1/2018 |
| WO | 2018152894 A1 | 8/2018 |
| WO | 2021036411 A1 | 3/2021 |

OTHER PUBLICATIONS

State Intellectual Property Office of the People's Republic of China, Office Action and Search Report Issued in Application No. 201910903505.1, Mar. 24, 2021, 15 pages. (Submitted with Machine Translation).
ISA State Intellectual Property Office of the People's Republic of China, International Search Report Issued in Application No. PCT/CN2020/095659, Sep. 23, 2020, WIPO, 6 pages.
ISA State Intellectual Property Office of the People's Republic of China, Written Opinion of the International Searching Authority Issued in Application No. PCT/CN2020/095659, Sep. 23, 2020, WIPO, 7 pages.
Office Action and Search Report issued Dec. 2, 2021 in Chinese Patent Application No. 201910903505.1 (with English machine translation); 21 pgs.
Office Action and Search Report issued Mar. 1, 2022 in Chinese Patent Application No. 201910803280.2 (with English machine translation); 22 pgs.
Chinese Office Action dated Nov. 2, 2021 for corresponding Chinese Application No. 201910803280.2; 22 bages; with Machine Translation.

* cited by examiner

DISPLAY PANELS, DISPLAY APPARATUSES AND PREPARATION METHODS OF DISPLAY PANEL

CROSS REFERENCE TO RELATED APPLICATIONS

This application is a continuation application of International Patent Application No. PCT/CN2020/095659, filed on Jun. 11, 2020, which claims priority to Chinese Patent Application No. 201910803280.2, titled "DISPLAY APPARATUS AND DISPLAY PANEL", filed on Aug. 28, 2019, and Chinese Patent Application No. 201910903505.1, titled "PREPARATION METHOD OF DISPLAY PANEL, DISPLAY PANEL AND DISPLAY APPARATUS", filed on Sep. 24, 2019, the contents of all of which are incorporated herein by reference.

TECHNICAL FIELD

The present application relates to the field of display technologies, and particularly to a display panel, a display apparatus and a preparation method of a display panel.

BACKGROUND

With rapid development of electronic devices, users have higher and higher requirements for screen-to-body ratio, and thus full-screen display of electronic devices has drawn more and more attention in the industry. For traditional electronic devices, such as mobile phones and tablet computers, generally one or more holes are to be opened on the display screen to dispose one or more front cameras, one or more receivers, one or more infrared sensing elements and the like in the hole region, in order to integrate the one or more front cameras, one or more receivers, one or more infrared sensing elements and the like.

However, the disposal of the holes will weaken the packaging effect of the display screen, and water and oxygen in the air may easily enter the display screen through the holes, thereby causing malfunction of the display screen and affecting a service life of the electronic device. In addition, a bezel of the hole region is relatively large, which is not conducive to increasing the screen-to-body ratio of the display apparatus.

SUMMARY

According to a first aspect of examples of the present application, a preparation method of a display panel is provided. The display panel includes a display region and a non-display region. The non-display region includes a hole region and an isolation region adjoining the display region and the hole region. The preparation method includes: providing a substrate; forming, on the substrate, an intermediate layer located in the display region and a first isolation structure located in the non-display region, where the first isolation structure is formed at least in the isolation region, the display region surrounds the first isolation structure, the first isolation structure includes a supporting portion and a partitioning portion located on the supporting portion, orthographic projections of the supporting portion and the partitioning portion on the substrate are overlapped, and the first isolation structure and the intermediate layer are formed simultaneously; obtaining a second isolation structure by etching a side portion of the supporting portion, where the orthographic projection of the partitioning portion in the second isolation structure on the substrate covers the orthographic projection of the supporting portion on the substrate and a maximum width of the supporting portion is smaller than a width of the partitioning portion, and the partitioning portion is configured to partition at least one film layer at a side of the partitioning portion away from the substrate; forming a tensile stress layer at a side of the partitioning portion away from the substrate; and opening a hole in the hole region.

According to a second aspect of examples of the present application, a display panel is provided. The display panel includes a substrate, a display region and a non-display region. The non-display region includes a hole region and an isolation region adjoining the display region and the hole region, the isolation region includes at least one second isolation structure, and the at least one second isolation structure at least partially surrounds the hole region. Each of the second isolation structures includes a supporting portion and a partitioning portion located on the supporting portion. An orthographic projection of the partitioning portion on the substrate covers an orthographic projection of the supporting portion on the substrate, and a maximum width of the supporting portion is smaller than a width of the partitioning portion. A tensile stress layer configured to apply a tensile stress to the partitioning portion is disposed on the partitioning portion.

According to a third aspect of examples of the present application, a display apparatus is provided, includes: a device body, in which a device region is provided with a light-sensing device configured for emitting or collecting light; a display panel, covering the device body. The display panel includes: a substrate; a display region; and a non-display region. The non-display region includes: a hole region; and an isolation region adjoining the display region and the hole region, where the isolation region comprises at least one second isolation structure, and the at least one second isolation structure at least partially surrounds the hole region. Each of the second isolation structures includes: a supporting portion; and a partitioning portion, located on the supporting portion, wherein an orthographic projection of the partitioning portion on the substrate covers an orthographic projection of the supporting portion on the substrate, and a maximum width of the supporting portion is smaller than a width of the partitioning portion. A tensile stress layer configured to apply a tensile stress to the partitioning portion is disposed on the partitioning portion. The light-sensing element is embedded in the hole region.

In the preparation method of the display panel, the display panel and the display apparatus according to the examples of the present application, the second isolation structure is formed in the isolation region of the display panel. The orthographic projection of the partitioning portion of the second isolation structure on the substrate covers the orthographic projection of the supporting portion on the substrate, and the maximum width of the supporting portion is smaller than the width of the partitioning portion. Therefore, when evaporating an organic light-emitting material or the like, no organic light-emitting material will be formed at a side of the supporting portion. That is, the organic light-emitting material layer breaks at the second isolation structure so that water and oxygen in the air cannot enter the display region through the organic light-emitting material in the hole region, thereby facilitating improving the service life of the display panel. In addition, the tensile stress layer configured to apply a tensile stress to the partitioning portion is disposed at a side of the partitioning portion away from the substrate to prevent the suspended partitioning portion from collapsing or falling off and ensure the reliability of partitioning performance of the partitioning portion.

DETAILED DESCRIPTION

Figure 1:
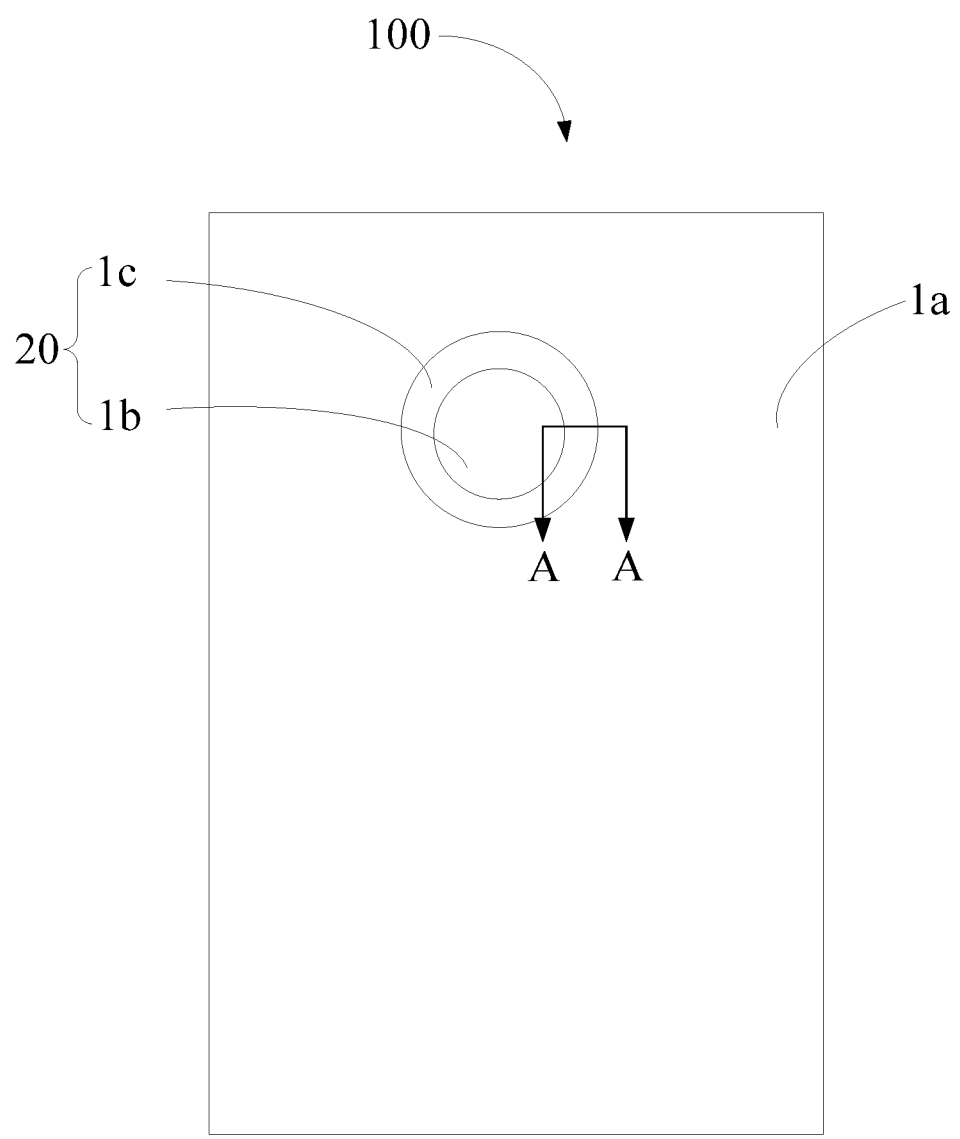
FIG. 1 is a top view of a display panel according to examples of the present application.

Examples will be described in detail herein, with the illustrations thereof represented in the drawings. When the following descriptions involve accompanying drawings, like numerals in different drawings refer to like or similar elements unless otherwise indicated. Implementations described in the following examples do not represent all implementations consistent with the present application. Rather, they are merely examples of apparatuses consistent with some aspects of the present application as detailed in the appended claims.

In order to solve the above problem, examples of the present application provide a display panel, a display apparatus and a preparation method of a display panel.

The preparation method of the display panel, the display panel and the display apparatus in the examples of the present application will be described in detail below in combination with the accompanying drawings. The features in the following examples and implementations may be supplemented or combined with each other in a case of no conflicts.

Figure 2:
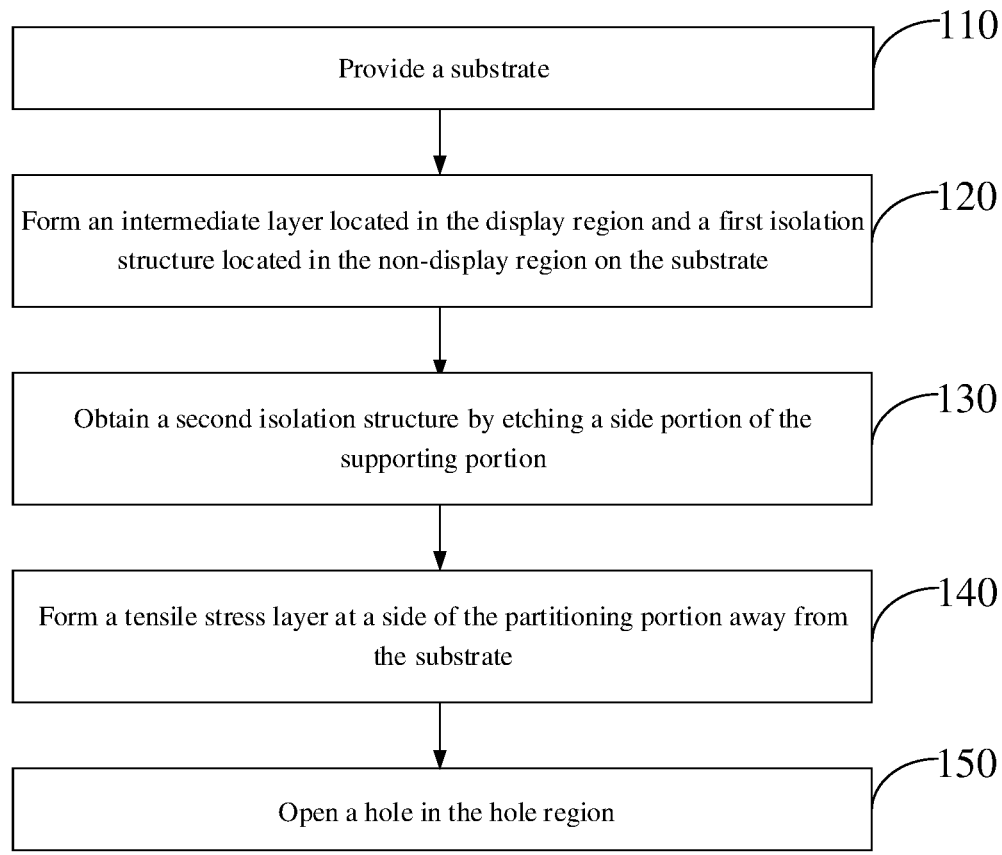
FIG. 2 is a flowchart of a preparation method of a display panel according to examples of the present application.
Figure 10:
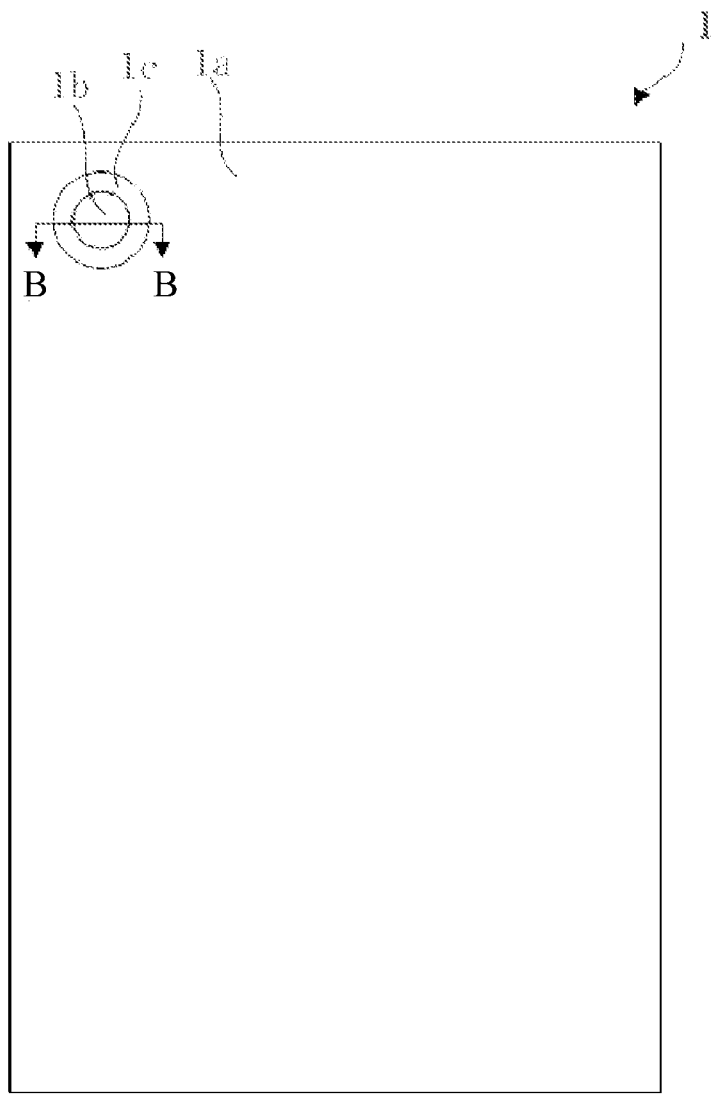
FIG. 10 is a top view of another display panel according to examples of the present application.

One or more examples of the present application provide a preparation method of a display panel. As shown in FIG. 1 and FIG. 10, the display panel 100 or 1 includes a display region 1a and a non-display region 20. The non-display region 20 includes a hole region 1b and an isolation region 1c adjoining the display region 1a and the hole region 1b. As shown in FIG. 2, the preparation method of the display panel includes the following steps 110-150.

At step 110, a substrate is provided.

In an example, the substrate may be a flexible substrate made of polyimide (PI). In another example, the substrate may be a rigid substrate made of glass, metal, plastic, and the like.

At step 120, an intermediate layer located in the display region and a first isolation structure located in the non-display region are formed on the substrate, where the first isolation structure is formed at least in the isolation region, the display region surrounds the first isolation structure, and the first isolation structure includes a supporting portion and a partitioning portion located on the supporting portion. Orthographic projections of the supporting portion and the partitioning portion on the substrate are overlapped, and the first isolation structure and the intermediate layer are formed simultaneously. Illustratively, the first isolation structure may be of an annular structure.

Since the first isolation structure in the non-display region 20 and the intermediate layer in the display region 1a are formed simultaneously at this step, the preparation of the first isolation structure does not increase the preparation procedure of the display panel. The intermediate layer may include at least one conductive layer; or the intermediate layer may include a buffer layer, an isolation layer, a semiconductor layer, a plurality of first electrodes, a plurality of gate electrodes, a gate insulating layer, a plurality of capacitor plates, a capacitor insulating layer, an inter-layer dielectric layer, a plurality of source electrodes, a plurality of drain electrodes, a passivation layer or a wiring layer.

In an example, the display region 1a is provided with a plurality of sub-pixels, where each of the sub-pixels includes a first electrode, a pixel definition layer on the first electrode, an organic light-emitting material layer located in an opening of the pixel definition layer, and a second electrode located on the organic light-emitting material layer. The first electrode may be an anode, and the second electrode may be a cathode. The cathodes of the plurality of sub-pixels may be provided as a planar electrode.

The display region 1a may further include a plurality of pixel circuits for driving the sub-pixels. The plurality of pixel circuits may be in one-to-one correspondence with the plurality of sub-pixels, that is, each of the pixel circuits drives one of the sub-pixels. The pixel circuit includes a transistor including a gate electrode, a source electrode and a drain electrode. The display region 1a may further include a plurality of data lines which are electrically connected with the pixel circuits to provide a data signal for the sub-pixels. The data lines may be located above the source electrodes and the drain electrodes of the transistors. The at least one conductive layer may include the source electrodes and the drain electrodes of the transistors, or the at least one conductive layer may include data lines.

The at least one conductive layer includes a first conductive film layer, a second conductive film layer located on the first conductive film layer, and a third conductive film layer located on the second conductive film layer. The supporting portion of the first isolation structure and the second conductive film layer are located in a same layer, and the partitioning portion and the third conductive film layer are located in a same layer.

In an example, the step of forming, on the substrate, the at least one conductive layer located in the display region and the first isolation structure located in the non-display region may be performed through the following steps 121 and 122.

At step 121, a first metal layer covering the display region and the non-display region, a second metal layer located on the first metal layer, and a third metal layer located on the second metal layer are formed on the substrate.

Figure 3:
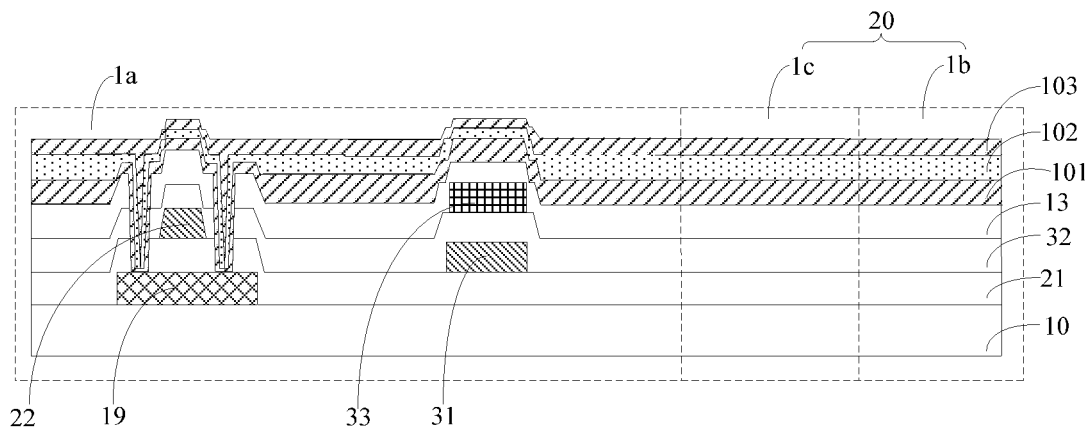
FIG. 3 is a partial sectional view of a first intermediate structure of the display panel shown in FIG. 1.

A first intermediate structure as shown in FIG. 3 may be obtained through step 121. As shown in FIG. 3, the first metal layer 101 is in direct contact with a lower surface of the second metal layer 102, and an upper surface of the second metal layer 102 is in direct contact with a lower surface of the third metal layer 103. The first metal layer 101, the second metal layer 102 and the third metal layer 103 are located above the substrate 10, all of which cover both the display region 1a and the non-display region 20.

In an example, the at least one conductive layer includes the source electrodes and the drain electrodes of the transistors. Before step 121 is performed, the preparation method of the display panel further includes the followings.

A semiconductor layer 19 is formed on the substrate 10, and a gate insulating layer 21 is formed on the semiconductor layer 19. Lower capacitor plates 31 of a plurality of capacitors C and a plurality of gate electrodes 22 are formed on the gate insulating layer 21, and a capacitor insulating layer 32 is formed on the lower capacitor plates 31 and the gate electrodes 22. A plurality of upper capacitor plates 33 are formed on the capacitor insulating layer 32, and an inter-layer dielectric layer 13 is formed on the upper capacitor plates 33. Next, a plurality of through holes (not shown) penetrating through the gate insulating layer 21, the capacitor insulating layer 32 and the inter-layer dielectric layer 13 are formed. The first metal layer 101, the second metal layer 102 and the third metal layer 103 are formed on the inter-layer dielectric layer 13, and partially enter the through holes disposed in the gate insulating layer 21, the capacitor insulating layer 32 and the inter-layer dielectric layer 13.

At step 122, the first metal layer, the second metal layer and the third metal layer are patterned, where the first metal layer, the second metal layer and the third metal layer which are not etched in the display region are the first conductive film layer, the second conductive film layer and the third conductive film layer of the at least one conductive layer, respectively, and the second metal layer and the third metal layer which are not etched in the non-display region are the supporting portion and the partitioning portion of the first isolation structure, respectively.

In an example, the first metal layer 101, the second metal layer 102 and the third metal layer 103 may be etched by adopting a dry etching process.

Figure 4:
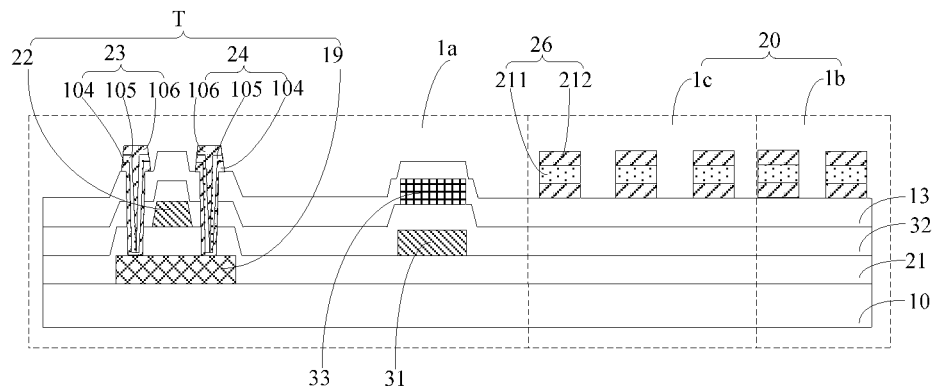
FIG. 4 is a partial sectional view of a second intermediate structure of the display panel shown in FIG. 1.

A second intermediate structure as shown in FIG. 4 may be obtained through steps 121 and 122. In the second intermediate structure shown in FIG. 4, a transistor T includes a gate electrode 22, a source electrode 23, a drain electrode 24 and a semiconductor layer 19, and at least one conductive layer includes the source electrodes 23 and the drain electrodes 24 of the transistors T. In the display region 1a, the unetched first metal layer 101 is first conductive film layers 104 of the source electrodes 23 and the drain electrodes 24, the unetched second metal layer 102 is second conductive film layers 105 of the source electrodes 23 and the drain electrodes 24, and the unetched third metal layer 103 is third conductive film layers 106 of the source electrodes 23 and the drain electrodes 24. In the non-display region 20, the unetched second metal layer 102 is the supporting portion 211 of the first isolation structure 26, and the unetched third metal layer 103 is the partitioning portion 212 of the first isolation structure 26. Orthographic projections of the supporting portion 211 and the partitioning portion 212 on the substrate 10 are overlapped, and the supporting portion 211 is disposed at a side of the inter-layer dielectric layer 13 away from the substrate. In the non-display region 20, the unetched first metal layer 101 is located under the first isolation structure 26, and orthographic projections of the unetched portion of the first metal layer 101 and the partitioning portion 212 on the substrate 10 may overlap.

In an example, two or more first isolation structures 26 are arranged at intervals in the non-display region 20, where the term "two or more" means two or greater than two. In the second intermediate structure shown in FIG. 4, there are five first isolation structures 26, where two of the first isolation structures 26 are disposed in the hole region 1b, and three of the first isolation structures 26 are disposed in the isolation region 1c.

In other examples, at least one conductive layer may further include a data line or other conductive film layers; or at least one conductive layer may include two conductive layers, where one conductive layer and the supporting portion 211 of the first isolation structure 26 are located in a same layer, and the other conductive layer and the partitioning portion 212 of the first isolation structure 26 are located in a same layer.

In an example, the first metal layer 101 and the third metal layer 103 are made of the same material, for example, the first metal layer 101 and the third metal layer 103 may be made of titanium, and the second metal layer 102 may be made of aluminum. In other examples, the first metal layer 101, the second metal layer 102 and the third metal layer 103 may be made of another material, respectively.

At step 130, the second isolation structure is obtained by etching a side portion of the supporting portion, where an orthographic projection of the partitioning portion in the second isolation structure on the substrate covers an orthographic projection of the supporting portion on the substrate, that is, the orthographic projection of the supporting portion on the substrate is located within the orthographic projection of the partitioning portion on the substrate, and a maximum width of the supporting portion is smaller than a width of the partitioning portion. For example, a maximum transverse width of the supporting portion in a direction perpendicular to the stacking direction of the display panel is smaller than a transverse width of the partitioning portion in the direction perpendicular to the stacking direction of the display panel.

In the direction perpendicular to the stacking direction of the display panel, the supporting portion includes two opposing sides which are the side portions of the supporting portion.

Figure 5:
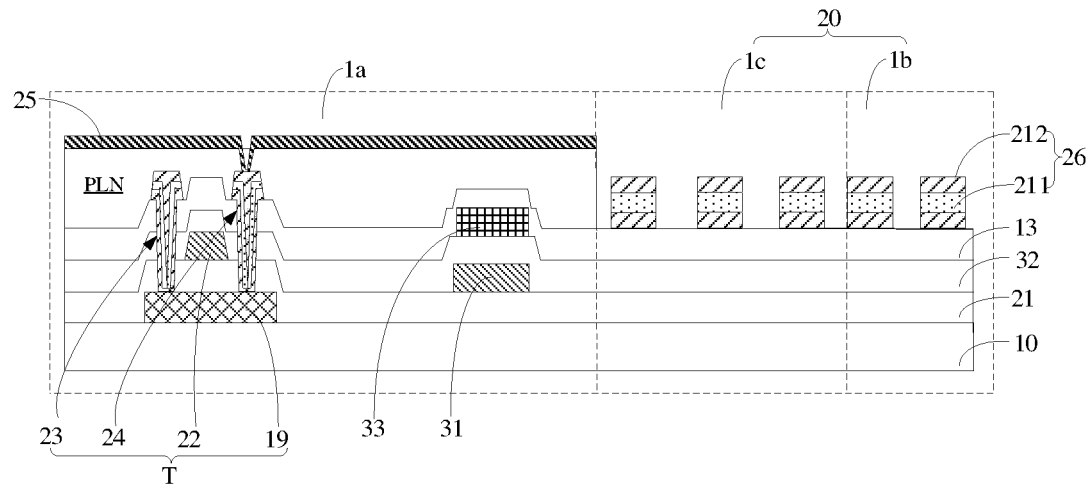
FIG. 5 is a partial sectional view of a third intermediate structure of the display panel shown in FIG. 1.
Figure 6:
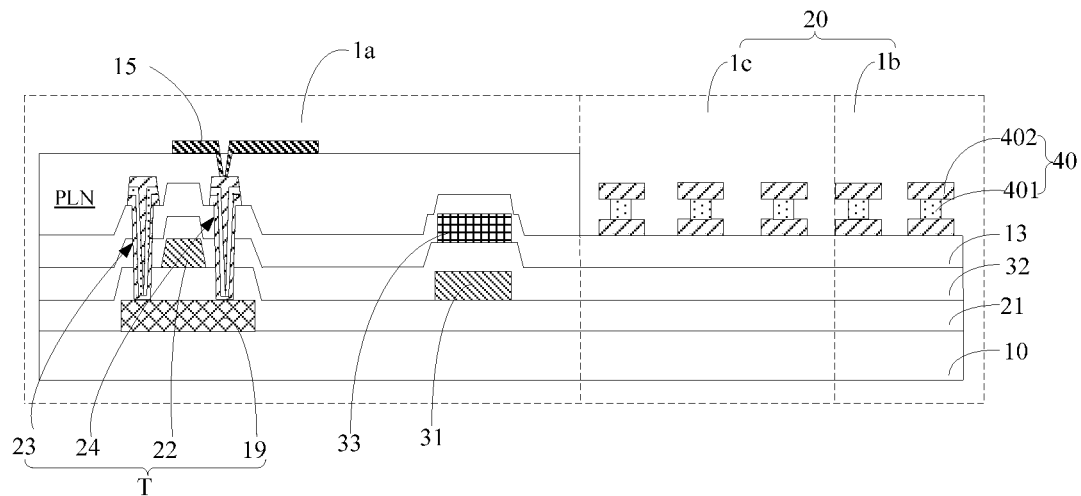
FIG. 6 is a partial sectional view of a fourth intermediate structure of the display panel shown in FIG. 1.

In an example, a first electrode layer 25 may be formed on at least one conductive layer, and a third intermediate structure as shown in FIG. 5 may be obtained. As shown in FIG. 5, the first electrode layer 25 only covers the display region 1a and does not cover the non-display region 20. Then, a fourth intermediate structure shown in FIG. 6 may be obtained by etching the first electrode layer 25 and the supporting portion 211. In the fourth intermediate structure shown in FIG. 6, a plurality of first electrodes 15 are obtained as anode blocks after the first electrode layer 25 is etched. Before the first electrode layer 25 is formed, the preparation method of the display panel further includes: forming a planarization layer PLN on the source electrode 23 and the drain electrode 24, where the planarization layer PLN only covers the display region 1a. The first electrode layer 25 is formed on the planarization layer PLN.

In an example, the first electrode layer and the supporting portion are etched so that the first electrode layer is patterned and the second isolation structure is obtained by etching the side portion of the supporting portion at the same time. The above can be realized through the following process.

The first electrode layer 25 and the supporting portion 211 are etched simultaneously by adopting a wet etching process so that a plurality of first electrodes 15 are obtained as anode blocks by patterning the first electrode layer 25, and the second isolation structure 40 is obtained by etching the side portion of the supporting portion 211 simultaneously.

Because the supporting portion 211 in the non-display region 20 and the first electrode layer 25 in the display region 1a are etched in a same procedure, the preparation procedure of the display panel will not be increased.

When the first electrode layer 25 and the supporting portion 211 are etched by adopting the wet etching process, a suitable etching solution may be selected to only corrode the first electrode layer 25 and the supporting portion 211 without corroding the partitioning portion 212.

In an example, as shown in FIGS. 4-9 and FIG. 14, for the display panels 100 and 4, there are two or more second isolation structures 40 which are arranged at intervals in the non-display region 20 where two or more includes two and greater than two. In the fourth intermediate structure shown in FIG. 6, there are five second isolation structures 40 which are distributed in the isolation region 1c and the hole region 1b. When there are two or more second isolation structures 40, it is more conducive to preventing water and oxygen in the air from entering the display region through the organic light-emitting material layer in the hole region, thereby increasing the service life of the display panel. In one or more embodiments, the number of second isolation structures 40 may not be limited to five. In some examples, since the second isolation structures 40 in the hole region 1b will be finally etched off, the second isolation structures 40 may be disposed only in the isolation region 1c. Compared with one second isolation structure 40, several second isolation structures 40 may improve the partitioning effect on the organic light-emitting material layer 17.

Figure 11:
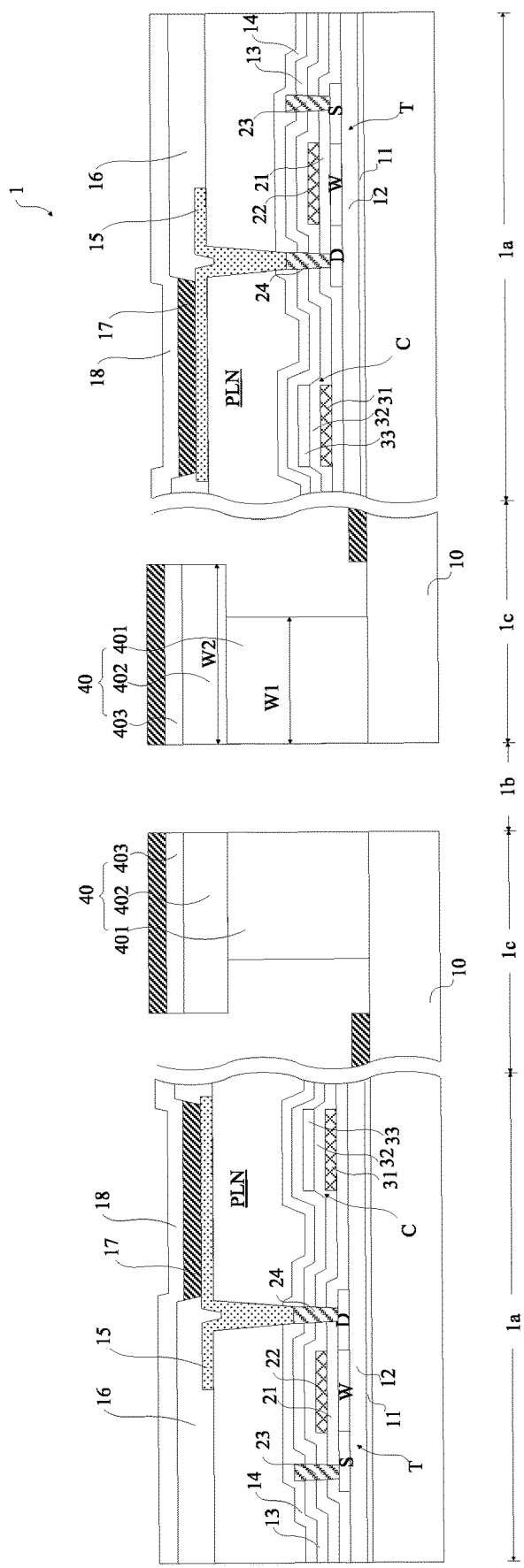
FIG. 11 is a sectional view taken along a B-B line in FIG. 10.
Figure 12:
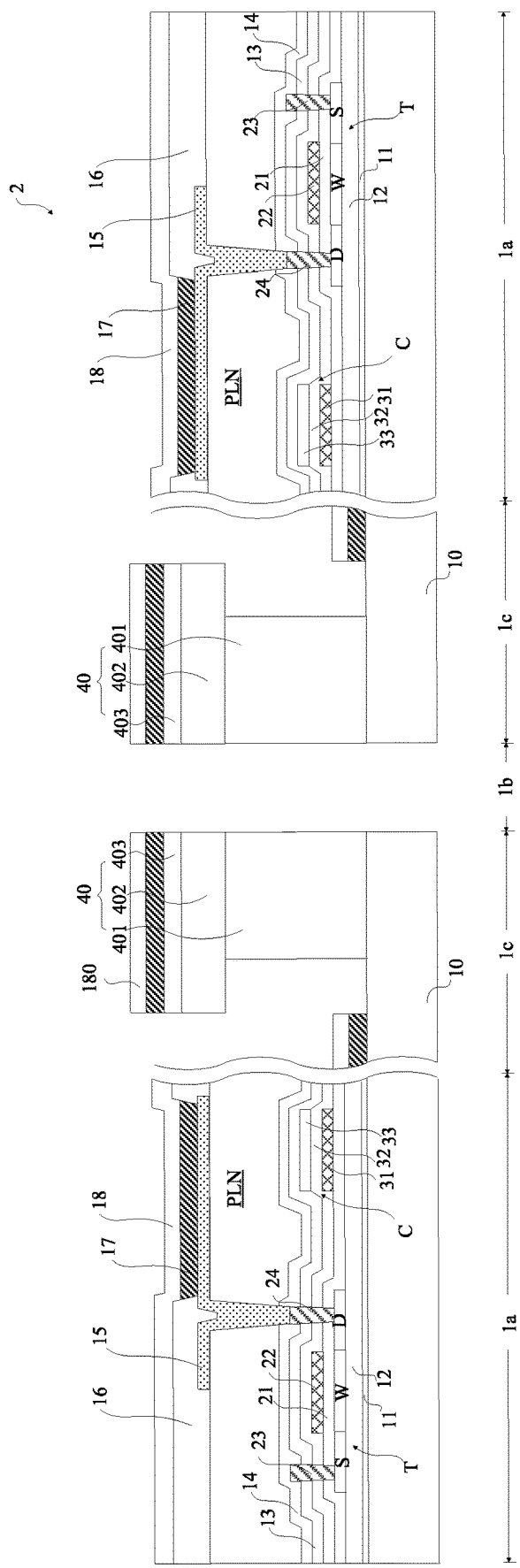
FIG. 12 is a sectional schematic diagram of another display panel according to examples of the present application.

Optionally, as shown in FIGS. 10 and 11, another structure of the supporting portion together with the partitioning portion is showed. A partitioning portion 402 of a second isolation structure 40 includes a first inorganic material layer. Compared with organic material, inorganic material has a better partitioning effect on an organic light-emitting material layer 17. The first inorganic material layer may include at least one of a transparent conductive oxide layer, a metal layer or a semiconductor layer, or may include a stack of a first transparent conductive oxide layer, a silver metal layer, and a second transparent conductive oxide layer, for example, a stacked structure of an anode. A supporting portion 401 is directly disposed on the substrate 10, and includes a second inorganic material layer. The second inorganic material layer may include at least one of a silicon nitride layer, a silicon dioxide layer, a metal layer, a semiconductor layer or a transparent conductive oxide layer, or may include a stack of the first transparent conductive oxide layer, the silver metal layer and the second transparent conductive oxide layer. Studies show that an adhesive force of the organic light-emitting material layer 17 on organic material is stronger than on inorganic material. Therefore, the inorganic material may reduce the probability that the organic light-emitting material layer 17 adheres to the supporting portion 401. In FIG. 11, a vertical section of the supporting portion 401 is a rectangle. In other examples, the vertical section of the supporting portion 401 or section of the supporting portion 401 along a stacking direction of the display panel may be a regular trapezoid or inverted trapezoid. A specific shape of the supporting portion 401 is not limited in the present application.

In this example, a height of the supporting portion 401 is at least greater than a thickness of the organic light-emitting material layer 17. The height of the supporting portion 401 refers to a distance between a bottom wall and a top wall of the supporting portion 401, which is an absolute value.

Figure 16:
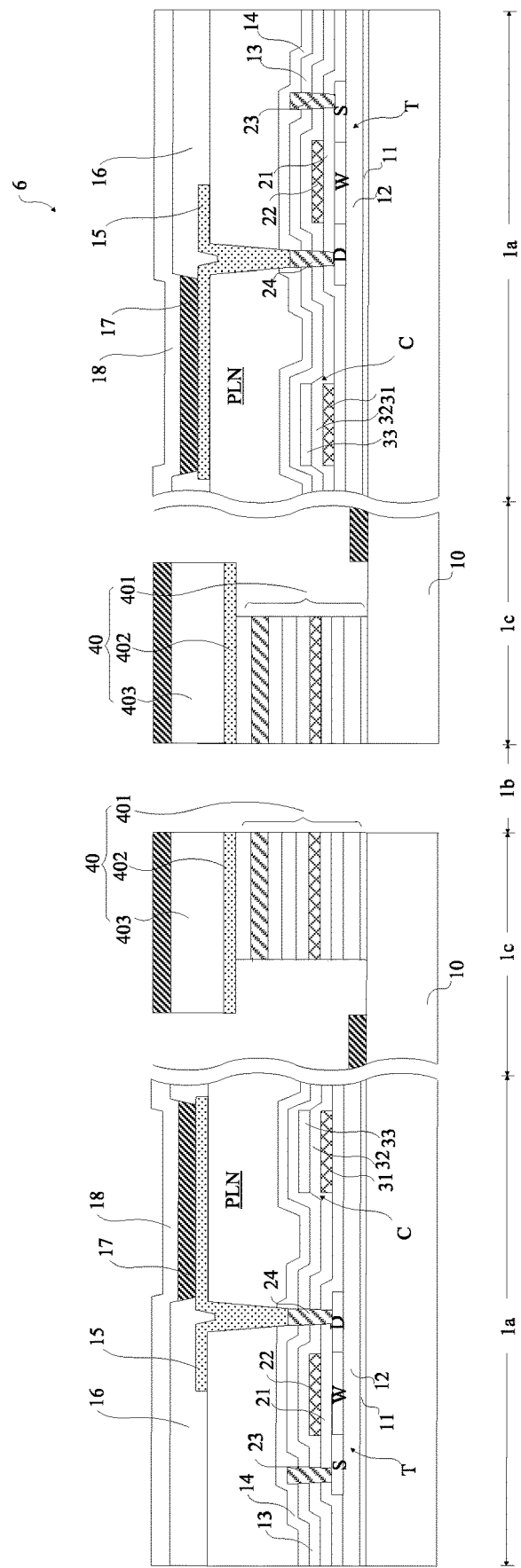
FIG. 16 is a sectional schematic diagram of another display panel according to examples of the present application.

In FIG. 16, the supporting portion 401 and a below-detailed intermediate layer, such as a buffer layer 11, an isolation layer 12, a semiconductor layer 19, a gate insulating layer 21, a plurality of gate electrodes 22 and a plurality of lower capacitor plates 31, a capacitor insulating layer 32, a plurality of upper capacitor plates 33, an inter-layer dielectric layer 13, a plurality of source electrodes 23 and a plurality of drain electrodes 24, and a passivation layer 14 are formed in a same procedure. The partitioning portion 402 and a plurality of first electrodes 15 are formed in a same procedure. A tensile stress layer 403 and a pixel definition layer 16 which are described below are formed in a same procedure.

Figure 17:
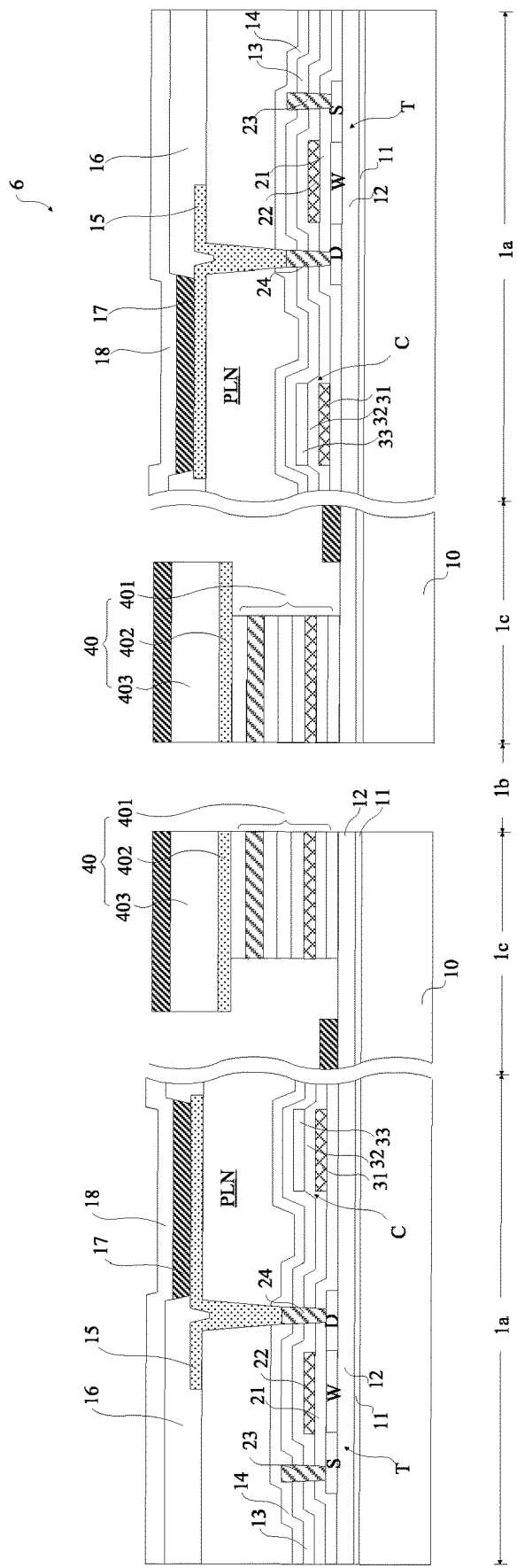
FIG. 17 is a sectional schematic diagram of another display panel according to examples of the present application.

A display panel 6 in FIG. 17 is different from that in FIG. 16 in that the supporting portion 401 and the intermediate layer, such as the semiconductor layer 19, the gate insulating layer 21, the gate electrodes 22 and the lower capacitor plates 31, the capacitor insulating layer 32, the upper capacitor plates 33, the inter-layer dielectric layer 13, the source electrodes 23, the drain electrodes 24 and the passivation layer 14, are formed in a same procedure. In other words, the supporting portion 401 may rest on part of the film layers as long as the height of the supporting portion 401 is at least greater than the thickness of the organic light-emitting material layer 17, or at least greater than a sum of thicknesses of the organic light-emitting material layer 17 and the second electrode 18.

Figure 14:
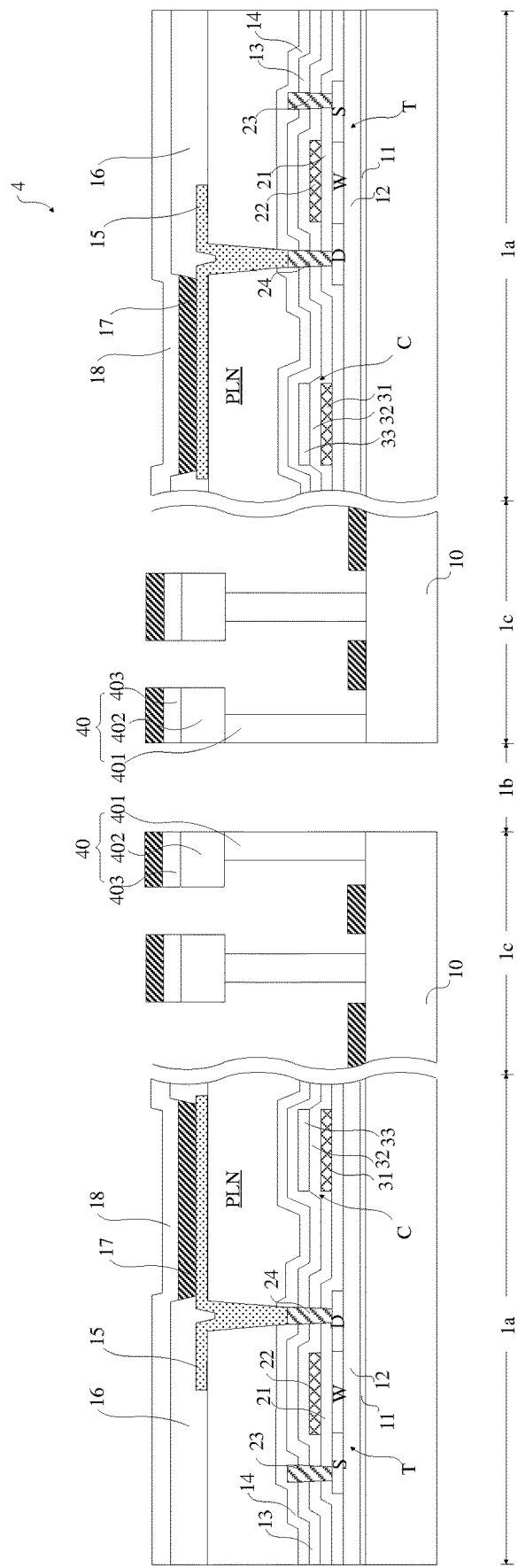
FIG. 14 is a sectional schematic diagram of another display panel according to examples of the present application.

In the structure shown in FIG. 14, two second isolation structures 40 are disposed in the isolation region 1c at a side of the hole region 1b. In other examples, the number of the first isolation structures 26 or second isolation structures 40 disposed in the non-display region 20 may be different from the number described above.

In addition, in FIG. 14, vertical sections of part of second isolation structures 40 are T-shaped. Compared with partitioning of the organic light-emitting material layer 17 on one wall, partitioning of the organic light-emitting material layer 17 on two opposing walls of the second isolation structure 40 can improve the partitioning effect.

In an example, a section of the supporting portion 401 of the second isolation structure 40 in a longitudinal direction is a rectangle or an inverted trapezoid. In the fourth intermediate structure shown in FIG. 6, the section of the supporting portion 401 of the second isolation structure 40 in the longitudinal direction is a rectangle. In other examples, the section of the supporting portion 401 of the second isolation structure 40 in the longitudinal direction may be an inverted trapezoid. The inverted trapezoid refers to that a transverse size of the supporting portion 401 gradually decreases in a direction from top to bottom. The longitudinal direction refers to the stacking direction of the display panel.

Figure 7:
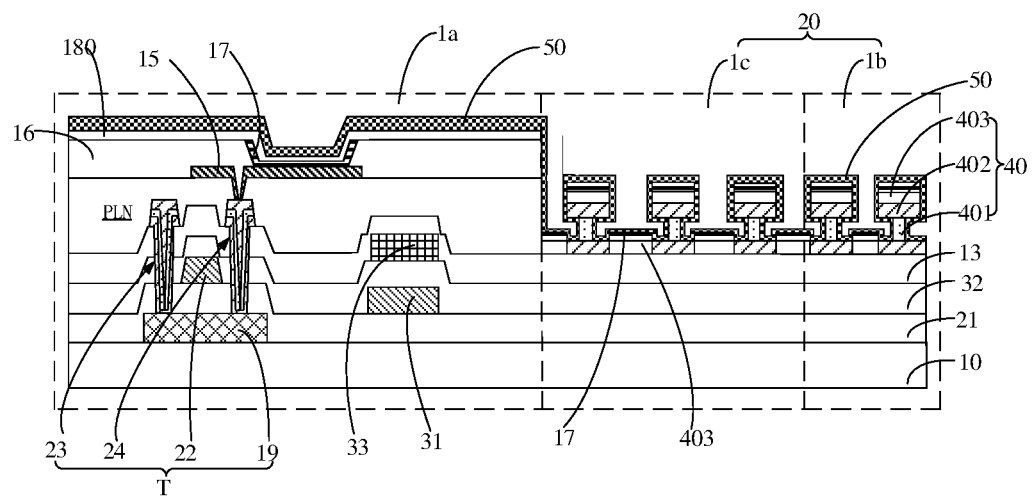
FIG. 7 is a partial sectional view of a fifth intermediate structure of the display panel shown in FIG. 1.
Figure 15:
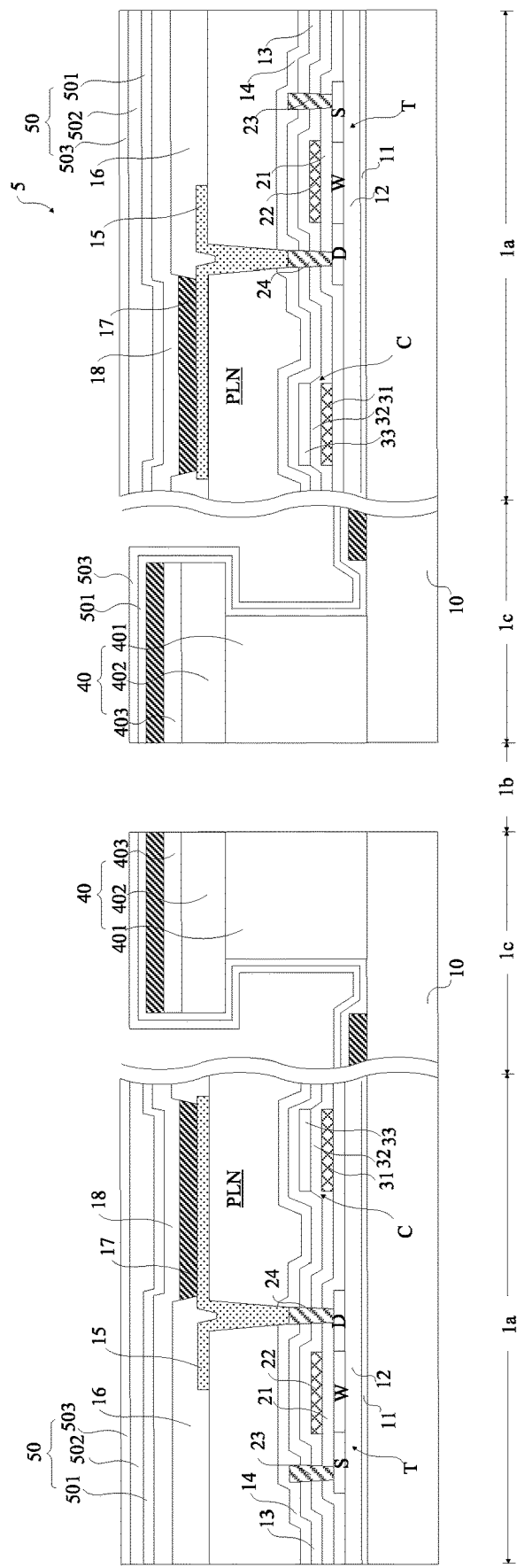
FIG. 15 is a sectional schematic diagram of another display panel according to examples of the present application.

At step 140, a tensile stress layer 403 is formed at a side of the partitioning portion 402 away from the substrate 10. As shown in FIG. 7, the preparation method of the display panel further includes: forming a pixel definition layer 16 in the display region 1a with a plurality of pixel openings, forming the organic light-emitting material layer 17 inside the pixel openings of the display region 1a and in the non-display region 20, forming a second electrode layer 180 on the organic light-emitting material layer 17, and forming an encapsulation layer 50 covering the display region 1a and the non-display region 20 on the second electrode layer 180. Further, before the encapsulation layer 50 is formed, the tensile stress layer 403 is formed at a side of the partitioning portion 402 away from the substrate 10 to apply a tensile stress to the partitioning portion 402. The encapsulation layer 50 may be a thin-film encapsulation layer including an organic material and an inorganic material stacked alternately. Further, the encapsulation layer 50 at least covers the side portion of the supporting portion 401. As shown in FIG. 7 and FIG. 15, the encapsulation layer 50 further covers the side portion of the partitioning portion 402 of the second isolation structure 40 and encloses the second isolation structure 40.

The orthographic projection of the partitioning portion 402 of the second isolation structure 40 on the substrate 10 covers the orthographic projection of the supporting portion 401 on the substrate 10, and the maximum width of the supporting portion 401 is smaller than the width of the partitioning portion 402. In this case, when the organic light-emitting material 17 or the like is evaporated, no organic light-emitting material layer 17 is formed on the sidewall of the supporting portion 401 of the second isolation structure 40, that is, the organic light-emitting material layer 17 breaks at the second isolation structure 40, while the encapsulation layer 50 covers the sidewall of the supporting portion 401. Since the organic light-emitting material layer 17 breaks at the second isolation structure 40 and the encapsulation g layer 50 covers the sidewall of the supporting portion 401 of the second isolation structure 40, water and oxygen in the air cannot enter the display region 1a through the organic light-emitting material layer 17 in the hole region 1b, thereby facilitating increasing the service life of the display panel.

Optionally, referring to FIG. 15 again, the display panel 5 includes the encapsulation layer 50. The encapsulation layer 50 includes a first inorganic encapsulation layer 501, an organic encapsulation layer 502 and a second inorganic encapsulation layer 503 from bottom to top. The supporting portion 401 at least includes a second inorganic material layer. Therefore, when the first inorganic encapsulation layer 501 is covered on the supporting portion 401, external water and oxygen can be blocked from entering the display region 1a.

In addition, in the display panel 5, a dam may be disposed at a position in the display region 1a close to the isolation region 1c to restrict the organic encapsulation layer 502 in the display region 1a from flowing toward the isolation region 1c. A plurality of dams may be disposed in the form of multiple rings.

Optionally, a dam may also be disposed on the second isolation structure 40 to further restrict the organic encapsulation layer 502 in the display region 1a from flowing outwards. When there are a plurality of second isolation structures 40, the dam may be disposed on some of the second isolation structures 40 close to the display region 1a respectively. In an optional example, the dams at the position in the display region 1a and close to the isolation region 1c may be omitted, and only the dam on the second isolation structure 40 is used to restrict the organic encapsulation layer 502 in the display region 1a from flowing outwards.

As shown in FIGS. 7-9 and FIG. 12, the partitioning portions 402 of the second isolation structure 40 of the display panels 100 and 2 are also used to partition the second electrode layer 180. The second electrode layer 180 in the display region 1a is used to form the second electrode 18. When evaporating the second electrode layer, a shielding pattern corresponding to the hole region 1b and the isolation region 1c may be disposed on a mask so as not to evaporate the second electrode layer 180 in the hole region 1b and the isolation region 1c.

In this example, the pattern of the mask for evaporating the second electrode layer 180 may be simplified by not providing the pattern corresponding to the hole region 1b and the isolation region 1c. The height of the supporting portion 401 is at least greater than a sum of thicknesses of the organic light-emitting material layer 17 and the second electrode 18.

At step 150, a hole is opened in the hole region.

The display panels as shown in FIG. 8 and FIGS. 11-17 may be obtained through step 150. When the organic light-emitting material layer 17 is evaporated, a part of the partitioning portion 402 of the second isolation structure 40 is suspended thus achieving better partitioning effect on the organic light-emitting material layer 17. The organic light-emitting material layer 17 is partitioned such that external water and oxygen is prevented from entering the display region 1a and further damaging the organic light-emitting material layer 17 in the display region 1a, thus realizing a high qualification rate of the display panels. In addition, the partitioning portion 402 may automatically partition the organic light-emitting material layer 17, thereby avoiding using laser ablation to remove the organic light-emitting material layer 17 around the hole region 1b, which omits a thermal process. In this case, the performance of structures in the display region 1b will not be affected by the thermal process. Therefore, a distance between the hole region 1b and the display region 1a may be shortened, and a bezel of the hole region 1b may be reduced. Besides, the tensile stress layer 403 may apply a tensile stress to the partitioning portion 402 to prevent the suspended partitioning portion 402 from collapsing and falling off, to ensure reliable partitioning performance of the partitioning portion 402.

In an example, a hole may be opened by laser, and the film layer in the hole region is removed.

Back to FIGS. 10 and 11, the structure of the display panel 1 is described in detail. A buffer layer 11 and an isolation layer 12 may be disposed on the substrate 10. The buffer layer 11 may be made of a material with strong adhesivity such as silicon dioxide to increase a bonding force between the substrate 10 and the film layers on the buffer layer. The isolation layer 12 may be made of silicon nitride or a stacked structure of silicon oxide, silicon nitride and silicon oxide (ONO). When the substrate 10 is a flexible substrate, external water and oxygen may be prevented from entering each film layer in the display region 1a from the substrate 10. When the substrate 10 is a rigid substrate, impurity atoms in the rigid substrate 10 may be prevented from diffusing into each film layer in the display region 1a.

Sub-pixels in the display region 1a may be driven actively or passively. In FIGS. 11 and 16, taking the active driving mode as an example, a plurality of pixel driving circuits are disposed between the first electrodes 15 and the substrate 10 to provide a data signal voltage to each first electrode 15. Each pixel driving circuit at least includes a plurality of transistors T and one or more storage capacitor C. The transistor T includes a semiconductor layer 19, a gate insulating layer 21 and a gate electrode 22 from bottom to top. The semiconductor layer 19 includes a source region S, a drain region D, and a channel region W between the source region S and the drain region D. The storage capacitor C includes a lower capacitor plate 31, a capacitor insulating layer 32 and an upper capacitor plate 33 from bottom to top. The gate electrode 22 and the lower capacitor plate 31 both may be made of a metal, and prepared in a same procedure. When the sub-pixels are driven passively, the data signal voltage of the first electrodes 15 comes from a data signal channel of a Display Driver Integrated Circuit (DDIC). The driving mode of the sub-pixels is not limited in this example. In other words, the film layer structure in the display region 1a is not limited in this example.

The upper capacitor plate 33 may also be made of a metal. The inter-layer dielectric layer 13 may be disposed on the upper capacitor plate 33. A trench may be disposed in the inter-layer dielectric layer 13, the capacitor insulating layer 32 and the gate insulating layer 21, and filled with metal to form the source electrode 23 in electrical connection with the source region S and the drain electrode 24 in electrical connection with the drain region D respectively. The passivation layer 14 is disposed on the source electrode 23, the drain electrode 24 and the inter-layer dielectric layer 13.

The inter-layer dielectric layer 13 may be made of silicon dioxide. The passivation layer 14 may be made of at least one of silicon nitride, silicon carbide, silicon dioxide or silicon carbonitride.

The planarization layer PLN may be disposed on the passivation layer 14. The planarization layer PLN has a plurality of through holes exposing the drain electrodes 24, and the first electrodes 15 are formed on the planarization layer PLN after the through holes are filled. The planarization layer PLN further has a plurality of wiring layers (not shown) used to be electrically connected with the source electrodes 23 and the gate electrodes 22, respectively. The wiring layer may be made of a metal.

The pixel definition layer 16 is disposed on the first electrodes 15 and the planarization layer PLN not covered by the first electrodes 15. The first electrodes 15 may be anodes, for example, may each be a stacked layer of a first transparent conductive oxide layer, a silver metal layer and a second transparent conductive oxide layer.

Figure 13:
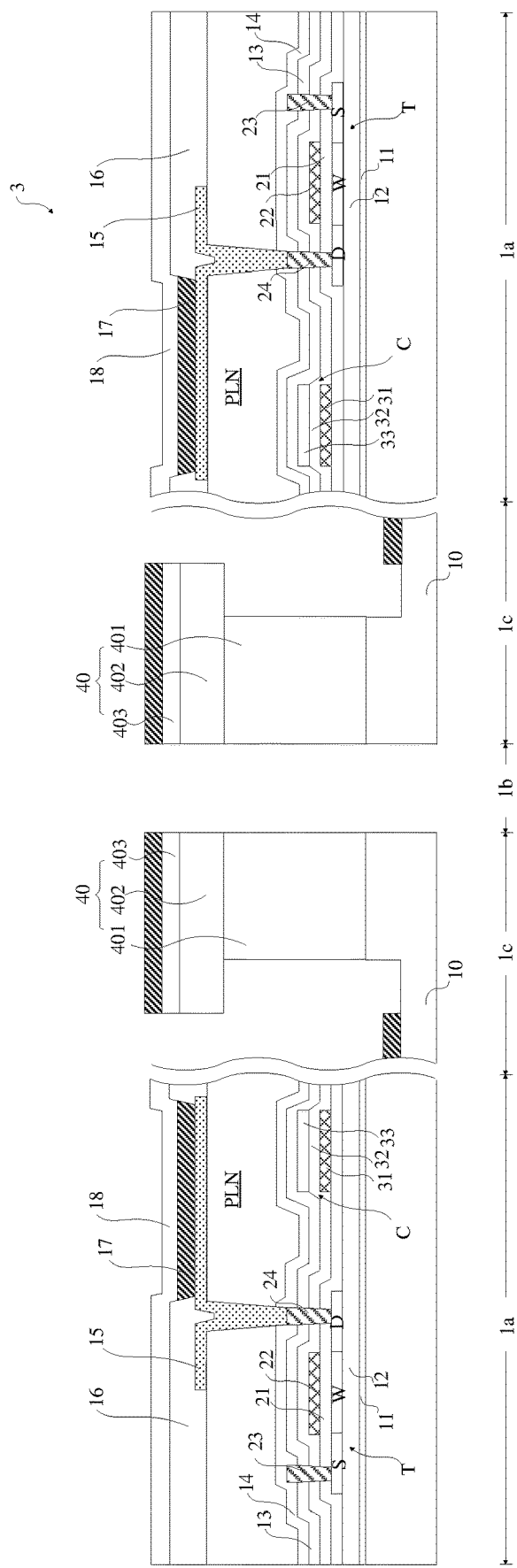
FIG. 13 is a sectional schematic diagram of another display panel according to examples of the present application.

Optionally, the supporting portion 401 may be of another structure. As shown in FIG. 13, the supporting portion 401 in the display panel 3 includes an organic material layer and a second inorganic material layer stacked from bottom to top, i.e. in a direction away from the substrate 10. The organic material layer may be an upwardly-convex portion of the flexible substrate 10 in a region corresponding to the supporting portion 401.

Optionally, the supporting portion 401, the partitioning portion 402 and the tensile stress layer 403 may be formed in another manner. As shown in FIGS. 16 and 17, the supporting portion 401 and/or the partitioning portion 402 and/or the tensile stress layer 403 of the display panel 6 are formed in a same process as the film layer in the display region 1a.

In other words, a) while film layers in the display region 1a is formed, the supporting portion 401 and/or the partitioning portion 402 and/or the tensile stress layer 403 are formed; or b) while film layers in the display region 1a is formed, the second inorganic material layer and/or the first inorganic material layer and/or the tensile stress material layer are formed, and then, the supporting portion 401 and/or the partitioning portion 402 and/or the tensile stress layer 403 are formed correspondingly by dry etching or wet etching.

When the second isolation structure 40 is formed by dry etching or wet etching, a patterned mask layer may be formed on the first inorganic material layer. With the patterned mask layer as a mask, the first inorganic material layer and the second inorganic material layer are anisotropically etched by dry etching, and the first inorganic material layer then isotropically etched by dry etching or wet etching so as to form the partitioning portion 402 and the supporting portion 401 and then the tensile stress layer 403 is formed on the partitioning portion 402. Or, the tensile stress material layer and the patterned mask layer are firstly formed sequentially on the first inorganic material layer, and then, the tensile stress material layer, the first inorganic material layer and the second inorganic material layer are etched anisotropically by dry etching, and then the second inorganic material layer is etched isotropically by dry etching or wet etching so as to form the supporting portion 401, the partitioning portion 402 and the tensile stress layer 403.

Optionally, the supporting portion 401 and at least one of the buffer layer 11, the isolation layer 12, the semiconductor layer 19, the gate insulating layer 21, the gate electrodes 22 and the lower capacitor plates 31, the capacitor insulating layer 32, the upper capacitor plates 33, the inter-layer dielectric layer 13, the source electrodes 23 and the drain electrodes 24, the passivation layer 14 or the wiring layer may be formed in a same procedure; or, the supporting portion 401 may further include an inorganic material layer formed in an additional procedure. In an optional solution, the tensile stress layer 403 and the planarization layer PLN are formed in a same procedure. In an optional solution, the pixel definition layer 16 in the display region 1a is provided with one or more supporting columns (not shown) that support the patterned mask for evaporating the organic light-emitting material layer 17. The tensile stress layer 403 and the one or more supporting columns are formed in a same procedure.

Optionally, the supporting portion 401 and at least one of the buffer layer 11, the isolation layer 12, the semiconductor layer 19, the gate insulating layer 21, the gate electrodes 22 and the lower capacitor plates 31, the capacitor insulating layer 32, the upper capacitor plates 33 or the inter-layer dielectric layer 13 may be formed in a same procedure; or, the supporting portion 401 may further include an inorganic material layer formed in an additional procedure. The partitioning portion 402 and the source electrodes 23 and the drain electrodes 24 are formed in a same procedure. The tensile stress layer 403 and the passivation layer 14 are formed in a same procedure.

Optionally, the supporting portion 401 and at least one of the buffer layer 11, the isolation layer 12, the semiconductor layer 19, the gate insulating layer 21, the gate electrodes 22 and the lower capacitor plates 31 or the capacitor insulating layer 32 may be formed in a same procedure; or, the supporting portion 401 may further include an inorganic material layer formed in an additional procedure. The partitioning portion 402 and at least one of the upper capacitor plates 33 or the source electrodes 23 and the drain electrodes 24 may be formed in a same procedure. The tensile stress layer 403 and the passivation layer 14 are formed in a same procedure.

Optionally, the supporting portion 401 and at least one of the buffer layer 11, the isolation layer 12, the semiconductor layer 19 or the gate insulating layer 21 may be formed in a same procedure; or, the supporting portion 401 may further include an inorganic material layer formed in an additional procedure. The partitioning portion 402 and at least one of the gate electrodes 22 and the lower capacitor plates 31, the upper capacitor plates 33 or the source electrodes 23 and the drain electrodes 24 may be formed in a same procedure. The tensile stress layer 403 and the passivation layer 14 are formed in a same procedure.

Optionally, the supporting portion 401 and at least one of the buffer layer 11 or the isolation layer 12 may be formed in a same procedure; or, the supporting portion 401 may further include an inorganic material layer formed in an additional procedure. The partitioning portion 402 and at least one of the semiconductor layer 19, the gate electrodes 22 and the lower capacitor plates 31, the upper capacitor plates 33 or the source electrodes 23 and the drain electrodes 24 may be formed in a same procedure. The tensile stress layer 403 and the passivation layer 14 are formed in a same procedure.

Optionally, when the sub-pixels in the display region 1*a* are driven passively, the supporting portion 401 and/or the partitioning portion 402 and/or the tensile stress layer 403 may also be provided compatibly with the film layers in the display region 1*a*.

In the display panel 100 shown in FIG. 1 and the display panel 1 shown in FIG. 10, the hole regions 1*b* are circular. In other examples, the hole region 1*b* may be shaped like a water drop, rectangle, ellipse or the like. In addition, the isolation regions 1*c* shown in FIG. 1 and FIG. 10 are a closed loop. In other examples, the isolation region 1*c* may closely adjoin a bezel region, that is, the isolation region 1*c* is a non-closed loop.

Figure 9:
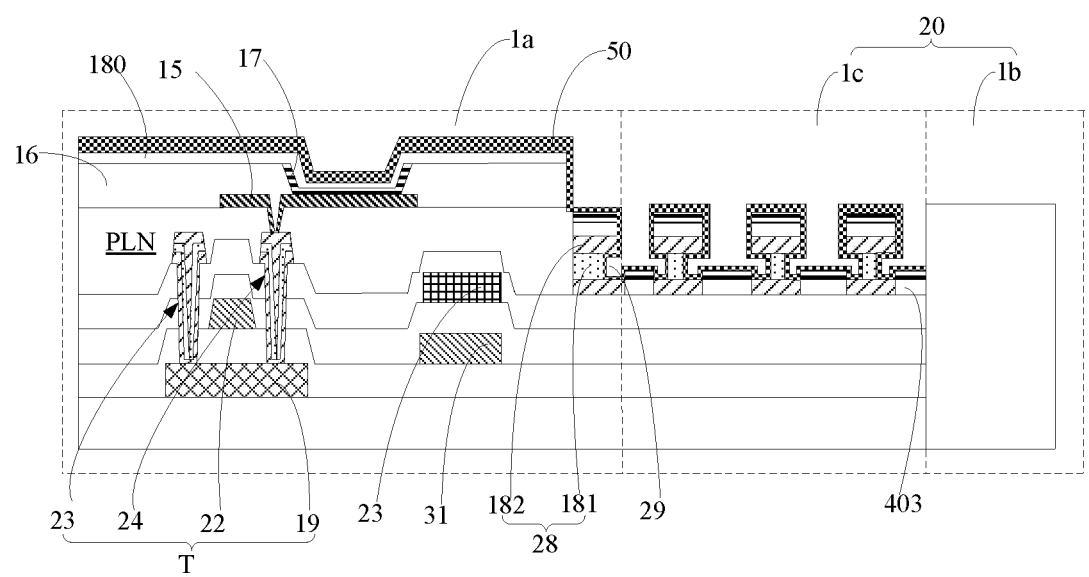
FIG. 9 is another schematic diagram of a display panel according to examples of the present application.

In an example, the preparation method of the display panel may further include: forming a recessed structure at a side portion of the display region 1*a* adjoining the non-display region 20. As shown in FIG. 9, the recessed structure 29 is formed at the side portion of the display region 1*a* adjoining the non-display region 20, and may be annular. By forming the recessed structure 29 at the side portion of the display region 1*a* adjoining the non-display region 20, for example, the organic light-emitting material layer 17 will break at the recessed structure 29, that is, no organic light-emitting material layer 17 is formed on a side wall of the recessed structure 29, water and oxygen in the air cannot enter the display region 1*a* through the recessed structure 29, thereby further increasing the service life of the display panel.

In an example, the recessed structure is formed at the side portion of the display region adjoining the non-display region by the following steps 160 and 170.

At step 160, a stacked structure is formed in an edge region of the display region adjoining the non-display region, where the stacked structure includes a first metal film layer and a second metal film layer located on the first metal film layer, and the edges of the first metal film layer are flush with the second metal film layer, for example, in a direction perpendicular to the stacking direction of the display panel. The first metal film layer, the second metal film layer and the at least one conductive layer are formed simultaneously.

Steps 160 and 122 are performed simultaneously. That is, at least one conductive layer, the first isolation structure 26 and the stacked structure are formed simultaneously in the process of etching the first metal layer 101, the second metal layer 102 and the first metal layer 103. As shown in FIG. 9, at least one conductive layer is formed in a middle region (that is, a region away from the isolation region) of the display region 1*a*, and the stacked structure 28 is formed in the edge region (that is, a region close to the isolation region) of the display region 1*a*. The stacked structure 28 includes the first metal film layer 181 and the second metal film layer 182 located on the first metal film layer 181.

At step 170, while the first electrode layer and the supporting portion are etched, a side of the first metal film layer facing toward the non-display region is etched, so that the first metal film layer is recessed away from the non-display region relative to the second metal film layer.

Steps 170 and 130 are performed simultaneously.

As shown in FIG. 8, FIG. 9 and FIGS. 11-17, the tensile stress layer 403 formed on the partitioning portion 402 of the second isolation structure 40 may be an organic film layer or inorganic film layer. When the organic film layer or inorganic film layer is formed on the partitioning portion 402 of the second isolation structure 40, the encapsulation performance for the non-display region 20 can be improved due to strong adhesivity between the encapsulation layer 50 and the inorganic film layer or the organic film layer. Further, an adhesive force between the organic film layer or the inorganic film layer and the partitioning portion 402 may apply a tensile stress to the partitioning portion 402, thereby avoiding collapse of the partitioning portion 402 and improving stability of the second isolation structure 40.

In an example, the tensile stress layer 403 formed on the partitioning portion of the second isolation structure 40 is the inorganic film layer. The material of the inorganic film layer includes at least one of silicon nitride, silicon oxide, silicon carbide or silicon carbonitride. The material of the organic film layer may include polyimide.

In another example, the tensile stress layer 403 formed on the partitioning portion of the second isolation structure 40 is the organic film layer. The organic film layer and the planarization layer PLN may be formed in a same procedure. In this case, the formation of the organic film layer will not increase the preparation procedure.

In the preparation method of the display panel according to examples of the present application, the second isolation structure is formed in the isolation region, the orthographic projection of the partitioning portion of the second isolation structure on the substrate covers the orthographic projection of the supporting portion on the substrate, and the maximum width of the supporting portion is smaller than the width of the partitioning portion. Therefore, no organic light-emitting material layer will be formed at a side portion of the supporting portion during evaporation of the organic light-emitting material layer, that is, the organic light-emitting material layer breaks at the second isolation structure, so that water and oxygen in the air cannot enter the display region through the organic light-emitting material layer in the hole region, thereby facilitating increasing the service life of the display panel. The preparation process of the second isolation structure includes preparation of the first isolation structure and etching of the side portion of the supporting portion. The first isolation structure and the intermediate layer of the display region are formed simultaneously, and the side portion of the supporting portion and, for example, the first electrode layer in the display region may be etched simultaneously. In this case, the preparation of the second isolation structure will not increase the preparation procedure of the display panel, thus avoiding complicating the preparation process of the display panel due to the formation of the second isolation structure. In addition, the tensile stress layer formed at a side portion of the partitioning portion away from the substrate may apply a tensile stress to the partitioning portion to prevent the suspended partitioning portion from collapsing and falling off and ensure reliable partitioning performance of the partitioning portion.

Figure 8:
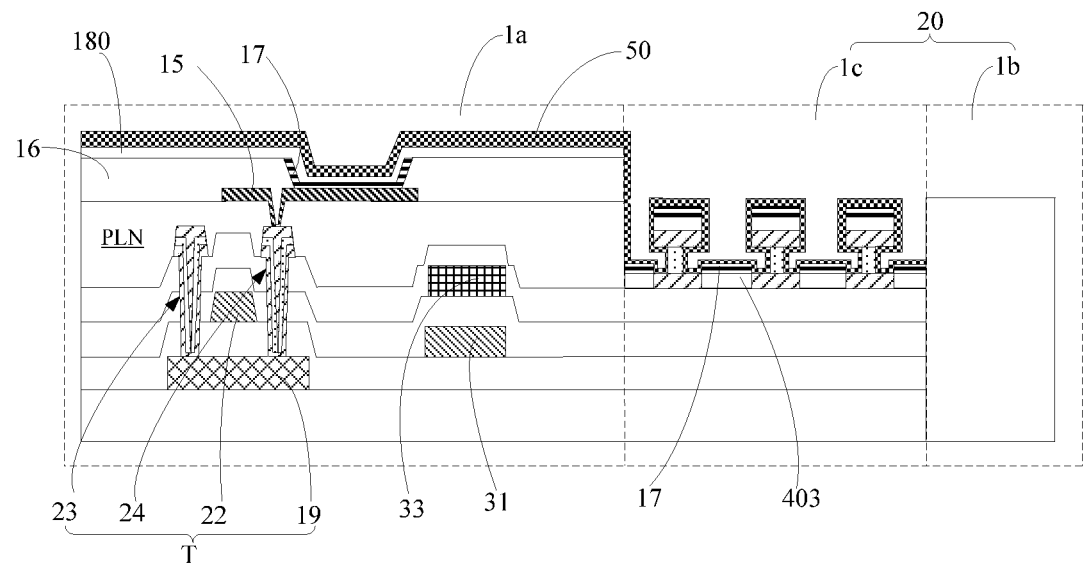
FIG. 8 is a view taken along an A-A line of the display panel shown in FIG. 1.

One or more examples of the present application further provides a display panel. As shown in FIGS. 1 and 10, the display panel includes a display region 1a and a non-display region 20. The non-display region 20 includes a hole region 1b and an isolation region 1c adjoining the display region 1a and the hole region 1b. As shown in FIG. 8 and FIG. 9, a second isolation structure 40 is disposed in the isolation region 1c, and surrounds the hole region 1b.

The display panel 100 and 1 both include a substrate 10 located in the display region 1a and the non-display region 20. At least one conductive layer located on the substrate 10 and a plurality of first electrode blocks located on the at least one conductive layer are disposed in the display region 1a. The second isolation structure 40 includes a supporting portion 401 and a partitioning portion 402 located on the supporting portion 401, an orthographic projection of the partitioning portion 402 on the substrate 10 covers an orthographic projection of the supporting portion 401 on the substrate 10, and a maximum width of the supporting portion 401 is smaller than a width of the partitioning portion 402. The second isolation structure 40 is formed at the step of forming the at least one conductive layer and the first electrode blocks.

The display panel 100 and 1 further include an organic light-emitting material layer 17 located on both the first electrode blocks and the second isolation structure, and an encapsulation layer 50 located on the organic light-emitting material layer 17. The organic light-emitting material layer 17 breaks at the second isolation structure 40, and the encapsulation layer 50 at least covers a side portion of the supporting portion 401.

In an example, the encapsulation layer 50 may cover the display region 1a and the isolation region 1c.

In an example, the display region 1a includes a plurality of pixel circuits and a data line, and each of the pixel circuits includes a plurality of transistors T. The at least one conductive layer includes a plurality of source electrodes 23 and a plurality of drain electrodes 24 of the transistors T, or the at least one conductive layer includes the data line.

The at least one conductive layer includes a first conductive film layer 104, a second conductive film layer 105 located on the first conductive film layer 104 and a third conductive film layer 106 located on the second conductive film layer 105. The supporting portion 401 and the second conductive film layer 105 are located in a same layer, and the partitioning portion 402 and the third conductive film layer 106 are located in a same layer.

In an example, the first conductive film layer 104, the third conductive film layer 106 and the partitioning portion 402 are made of titanium, and the second conductive film layer 105 and the supporting portion 401 are made of aluminum.

In an example, the display region 1a includes a plurality of sub-pixels. The sub-pixel includes a first electrode 15, the organic light-emitting material layer 17 located on the first electrode 15 and a second electrode layer 180 located on the organic light-emitting material layer 17. The first electrode 15 is an anode. The first electrode 15 may be of a stacked structure, including two indium tin oxide film layers and a silver film layer sandwiched between two indium tin oxide film layers.

In an example, two or more second isolation structures 40 are arranged at intervals in the isolation region 1c, where two or more includes two and greater than two.

In an example, a section of the supporting portion 401 of the second isolation structure 40 in a longitudinal direction is a rectangle or an inverted trapezoid. When the section of the supporting portion 401 in the stacking direction of the display panel is of an inverted trapezoid, it is more conducive to avoiding forming the organic light-emitting material layer at the side portion of the supporting portion 401.

In an example, the display panel 100 and 1 further includes a tensile stress layer 403 formed above the partitioning portion 402 of the second isolation structure 40, and the tensile stress layer 403 is an inorganic film layer or an organic film layer.

In an example, the tensile stress layer 403 is the inorganic film layer, and the material of the inorganic film layer includes silicon nitride or silicon oxide.

In an example, the tensile stress layer 403 is the organic film layer, the display region 1a further includes a planarization layer PLN, and the organic film layer and the planarization layer PLN are formed in a same procedure.

In an example, a recessed structure 29 is disposed at the side portion of the display region 1a adjoining the non-display region 20, the organic light-emitting material layer 17 breaks at the recessed structure 29, and the encapsulation layer 50 at least covers a side wall of the recessed structure 29.

In an example, the recessed structure 29 is formed while the at least one conductive layer and the first electrode blocks are formed.

Since a product example substantially corresponds to the preparation method examples, descriptions of relevant details and beneficial effects are referred to descriptions of the preparation method example, which is not repeated herein.

An example of the present application further provides a display apparatus. The display apparatus includes a device body, the display panel described in any of the above examples and one or more light-sensing elements. The device body includes an element region and the one or more elements are disposed in the element region. The element region corresponds to a hole region of the display panel or are embedded in the hole region so that the light-sensing elements can emit or collect light through the hole region.

The one or more light-sensing elements may include a camera and/or a light sensor.

After considering the specification and practicing the present application, persons skilled in the art may easily conceive of other implementations of the present application. The present application is intended to include any variations, uses and adaptive changes of the present application, and these variations, uses and adaptive changes follow the general principle of the present application and include common knowledge or conventional technical means in the art not disclosed in the present application. The specification and examples herein are intended to be illustrative only and the real scope and spirit of the present application are indicated by the claims of the present application.

It is to be understood that the present application is not limited to the precise structure described above and shown in the accompanying drawings, and various modifications and changes may be made without departing from the scope thereof. The scope of the present application is limited only by the appended claims.

The invention claimed is:

1. A display panel comprising:
    a substrate;
    a display region, wherein the display region comprises a tensile stress layer that comprises an organic material comprising polyimide;
    a non-display region comprising:

a hole region; and an isolation region adjoining the display region and the hole region, wherein the isolation region comprises a plurality of second isolation structures that at least partially surrounds the hole region, and each of the plurality of second isolation structures comprises:

a supporting portion; and a partitioning portion, located on the supporting portion, wherein an orthographic projection of the partitioning portion on the substrate covers an orthographic projection of the supporting portion on the substrate, and a maximum width of the supporting portion is smaller than a width of the partitioning portion, wherein the tensile stress layer is configured to apply a tensile stress to the partitioning portion and is disposed directly on the partitioning portion.

2. The display panel according to claim 1, further comprising:

at least one conductive layer located on the substrate;

a plurality of first electrodes located on the at least one conductive layer;

an organic light-emitting material layer located on the first electrodes and the second isolation structure, and an encapsulation layer located on the organic light-emitting material layer, wherein the organic light-emitting material layer breaks at the second isolation structure, and the encapsulation layer comprises a packaging layer that at least covers a side portion of the supporting portion.

3. The display panel according to claim 2, wherein the encapsulation layer further covers a side portion of the partitioning portion of the second isolation structure and encloses the second isolation structure.

4. The display panel according to claim 2, wherein the plurality of second isolation structures is further configured to partition a second electrode layer disposed at a side of the organic light-emitting material layer away from the substrate.

5. The display panel according to claim 2, wherein a recessed structure is disposed at a side portion of the display region adjoining the non-display region, the organic light-emitting material layer breaks at the recessed structure, and the encapsulation layer at least covers a side wall of the recessed structure.

6. The display panel according to claim 1, further comprising:

a plurality of pixel circuits and a data line in the display region, wherein each of the pixel circuits comprises a plurality of transistors, the at least one conductive layer comprises the data line, the at least one conductive layer comprises a first conductive film layer, a second conductive film layer located on the first conductive film layer, and a third conductive film layer located on the second conductive film layer, the supporting portion and the second conductive film layer are located in a same layer, and the partitioning portion and the third conductive film layer are located in a same layer.

7. The display panel according to claim 1, wherein the partitioning portion comprises a first inorganic material layer and the supporting portion at least comprises a second inorganic material layer.

8. The display panel according to claim 7, wherein the display region further comprises a passivation layer.

9. The display panel according to claim 7, wherein the supporting portion comprises an organic material layer and the second inorganic material layer stacked from bottom to top, the substrate is a flexible substrate, and the organic material layer is an upwardly-convex portion of the flexible substrate in a region corresponding to the supporting portion.

10. The display panel according to claim 1, wherein the plurality of second isolation structures is arranged at intervals in the isolation region.

11. The display panel according to claim 1, wherein a shape of a section of the supporting portion is a regular trapezoid or an inverted trapezoid.

12. A display apparatus, comprising:

a device body, having a device region, wherein one or more light-sensing elements configured to emit or collect light are disposed in the device region, and a display panel that covers the device body comprises:

a substrate;

a display region, wherein the display region comprises a tensile stress layer that comprises an organic material comprising polyimide;

a non-display region comprising:

a hole region; and an isolation region adjoining the display region and the hole region, wherein the isolation region comprises a plurality of second isolation structures that at least partially surrounds the hole region, and each of the second isolation structures comprises:

a supporting portion; and a partitioning portion, located on the supporting portion, wherein an orthographic projection of the partitioning portion on the substrate covers an orthographic projection of the supporting portion on the substrate, and a maximum width of the supporting portion is smaller than a width of the partitioning portion, wherein the tensile stress layer is configured to apply a tensile stress to the partitioning portion and is disposed directly on the partitioning portion.

* * * * *